United States Patent
Patel et al.

(10) Patent No.: US 11,044,823 B2
(45) Date of Patent: Jun. 22, 2021

(54) POSITIONING PINS FOR FOLDABLE PRINTED CIRCUIT BOARD

(71) Applicant: Continental Automotive Systems, Inc., Auburn Hills, MI (US)

(72) Inventors: Mitul Patel, Schaumburg, IL (US); Wai-Tak Ho, Palatine, IL (US); Donald J Zito, Fox River Grove, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 25 days.

(21) Appl. No.: 16/691,994

(22) Filed: Nov. 22, 2019

(65) Prior Publication Data

US 2021/0161021 A1 May 27, 2021

(51) Int. Cl.
*H05K 5/00* (2006.01)
*H05K 1/02* (2006.01)

(52) U.S. Cl.
CPC .......... *H05K 5/006* (2013.01); *H05K 1/0278* (2013.01); *H05K 2201/056* (2013.01); *H05K 2201/09063* (2013.01)

(58) Field of Classification Search
CPC .... H05K 5/0026; H05K 5/003; H05K 5/0204; H05K 1/0278; H05K 1/028; H05K 1/0284; H05K 2201/056; H05K 2201/09063; H05K 2201/09072
See application file for complete search history.

(56) References Cited

U.S. PATENT DOCUMENTS

| | | | | |
|---|---|---|---|---|
| 4,939,792 | A * | 7/1990 | Urbish | H04B 1/08 455/347 |
| 5,434,362 | A * | 7/1995 | Klosowiak | H05K 1/028 174/254 |
| 2008/0062038 | A1* | 3/2008 | Ouchi | H05K 7/20854 342/175 |
| 2008/0144290 | A1* | 6/2008 | Brandt | B60R 16/0239 361/720 |
| 2011/0170269 | A1* | 7/2011 | Blossfeld | H05K 5/006 361/752 |
| 2018/0242469 | A1* | 8/2018 | Suzuki | G06F 3/0688 |
| 2018/0343737 | A1* | 11/2018 | Morimoto | H01L 25/18 |
| 2019/0293674 | A1* | 9/2019 | Chino | G01P 1/023 |
| 2019/0320526 | A1* | 10/2019 | Sato | H05K 1/0271 |

* cited by examiner

*Primary Examiner* — Hoa C Nguyen

(57) ABSTRACT

An electronics device includes a folded printed circuit board which is folded about at least one fold region which defines a first section and a second section. A housing has a plurality of side portions. The first section of the folded printed circuit board is secured along an outer surface of a first side portion of the plurality of side portions. The housing further includes an interior. At least one first slot is defined within the interior and disposed along or near a second side portion arranged opposite the first side portion. At least one first pin member is disposed partly within the at least one first slot and extends therefrom. A distal end portion of the at least one first pin member engages with the second section of the folded printed circuit board so as to hold the second section in position over the interior of the housing.

20 Claims, 6 Drawing Sheets

POSITIONING PINS FOR FOLDABLE PRINTED CIRCUIT BOARD

FIELD OF INVENTION

The present invention generally relates to positioning and securing a printed circuit board (PCB) within an electronics housing, and particularly to the use of press-fit pins for positioning and securing a PCB within a housing.

BACKGROUND

Existing electronic control units (ECUs) include a housing; a foldable and/or flat PCB, a first lengthwise end section of which folds over a top portion of the housing and a second lengthwise end section of which folds over a bottom portion of the housing; and a foldable and/or folded housing cover, including a first lengthwise end section of which folds over the first lengthwise end section of the PCB and a second lengthwise end section of which folds over the second lengthwise end section of the PCB. Each lengthwise end section of the PCB is secured by screws to the housing for holding the end sections in place during the time that the lengthwise end sections of the housing cover for curing an adhesive between the housing and the end sections of the housing cover. Among other things, the use of screws to secure the PCB end sections undesirably occupies a non-trivial amount of space on the PCB and requires additional steps during the manufacturing/assembly process for the ECU, both of which result in increased manufacturing costs for the ECU.

SUMMARY

Example embodiments are generally directed to a method for manufacturing an electronics assembly and the resulting electronics assembly. In an example embodiment, an electronics device includes a folded printed circuit board which is folded about at least one fold region which defines a first section and a second section. A housing has a plurality of side portions. The first section of the folded printed circuit board is secured along an outer surface of a first side portion of the plurality of side portions. The housing further includes an interior at least partly defined by the side portions. At least one first slot is defined within the interior and disposed along or near a second side portion arranged opposite the first side portion. At least one first pin member is disposed partly within the at least one first slot and extends therefrom. A distal end portion of the at least one first pin member engages with the second section of the folded printed circuit board so as to hold the second section in position over the interior of the housing.

In one implementation, the at least one first slot includes a plurality of first slots and the at least one first pin member includes a plurality of first pin members. Each first pin member is partly inserted within a distinct first slot and the distal end portion of each first pin member engages with the second section of the folded printed circuit board for holding the second section relative to the housing.

The distal end of the at least one first pin member forms a press fit engagement with the second section of the folded printed circuit board. The at least one first pin member includes a body portion from which the distal end portion extends. A width of the body portion is greater than a width of the distal end such that the body portion forms a shoulder against which the second section of the folded printed circuit board contacts. The distal end portion of the at least one first pin member is inserted in or through a first aperture defined in the second section of the folded printed circuit board.

The electronics device further includes a folded housing cover which is folded about at least one fold region which defines a first section and a second section of the housing cover. The first section of the housing cover is attached to the first side portion of the housing, covering the first section of the folded printed circuit board, and the second section of the housing cover covers the second section of the folded printed circuit board and is secured to the housing.

The electronics device may further include a first adhesive securing the second section of the housing cover to the housing and a second adhesive securing the second section of the housing cover to the second section of the folded printed circuit board.

In an implementation, the folded printed circuit board further includes a second fold region spaced from the first fold region of the folded printed circuit board and defining a third section of the folded printed circuit board. The housing further includes at least one second slot defined within the interior of the of the housing and disposed along or near the second side portion of the housing. The at least one pin member includes at least one second pin member partly disposed in the at least one second slot. A distal end portion of the at least one second pin member engages with the third section of the folded printed circuit board so as to hold the third section in position under the interior of the housing. The housing cover further includes a second fold region spaced from the first fold region of the housing cover and defining a third section of the housing cover. The third section of the housing cover covers the third section of the folded printed circuit board and is secured to the housing. An opening of the at least second slot faces a direction that is opposite a direction of an opening of the at least one first slot faces.

In another example embodiment, a method for assembling an electronics device includes obtaining a housing, a foldable printed circuit board, a foldable housing cover, and a plurality of pin members. The housing has a plurality of side portions and a plurality of slots defined within an interior of the housing. The printed circuit board includes a fold region dividing the printed circuit board into a first section and a second section, and the housing cover includes a fold region dividing the housing cover into a first section and a second section. The method further includes attaching the first section of the printed circuit board and the first section of the housing cover to a first side portion of the housing. The pin members are inserted partly into the slots of the housing. The second section of the printed circuit board is positioned over the interior of the housing, engaging a distal end portion of each pin member with the second section of the printed circuit board. The engagement positions the second section of the printed circuit board in a final position over the interior of the housing.

A first adhesive is applied along a perimeter of the side portions of the housing. A second adhesive is applied on the second section of the housing cover in a central location thereof. The second section of the housing cover is positioned so that the second section of the housing cover covers the second section of the printed circuit board and contacts the first adhesive and so that the second section of the printed circuit board contacts the second adhesive. The first and second adhesives are then cured. The cured first adhesive forms a sealed bond between the housing and the second section of the housing cover. The cured second adhesive forms a bond between the second section of the housing cover and the second section of the printed circuit board.

Positioning the second section of the printed circuit board and engaging the distal end portion of each pin member with second section of the printed circuit board include moving the second section of the printed circuit board over the interior of the housing so that the distal end portions of the pin members are caused to pass in or through apertures defined in the second section of the printed circuit board. Causing the pin members to pass in or through the apertures of the second section of the printed circuit board creates a press fit engagement between each pin member and the second section of the printed circuit board. The press-fit engagements maintain the second section of the printed circuit board in position during curing of the first and second adhesives.

The second adhesive is a thermally conductive adhesive such that the cured second adhesive forms a thermal conductive path between the second section of the housing cover and the second section of the printed circuit board.

In another example embodiment, an electronics device includes a printed circuit board and a housing having a plurality of side portions. The printed circuit board is secured along an outer surface of the plurality of side portions. The housing further includes an interior at least partly defined by the side portions. At least one first slot is defined within the interior and disposed along or near a second side portion arranged opposite the first side portion. At least one first pin member is disposed partly within the at least one first slot and extends therefrom, a distal end portion of the at least one first pin member engaging with the printed circuit board so as to hold the printed circuit board in position over the interior of the housing.

In an implementation, the at least one first slot includes a plurality of first slots and the at least one first pin member includes a plurality of first pin members. Each first pin member is partly inserted within a distinct first slot and the distal end portion of each first pin member engages with the printed circuit board for holding the printed circuit board to the housing.

The distal end of the at least one first pin member forms a press fit engagement with the printed circuit board. The distal end portion of the at least one first pin member is inserted in or through at least one first aperture defined in the printed circuit board.

A housing cover is attached to the housing, and covers and is secured to the printed circuit board. The housing cover is attached to the housing with a first adhesive and is attached to the printed circuit board with a second adhesive that is thermally conductive.

BRIEF DESCRIPTION OF THE DRAWINGS

Aspects of the invention will be explained in detail below with reference to exemplary embodiments in conjunction with the drawings, in which.

DETAILED DESCRIPTION

The following description of the example embodiment(s) is merely exemplary in nature and is in no way intended to limit the invention, its application, or uses. In the figures and throughout the detailed description, the same reference numbers are used to identify identical or similar elements. For the sake of clarity, the elements are not shown to scale unless otherwise specified.

In general terms, example embodiments are directed to an electronics assembly including a housing; a foldable and/or flat PCB, a section of which folds over a top portion of the housing and another section of which folds over a bottom portion of the housing; and pin members, each of which is secured within a slot defined in the interior of the housing and has a distal end portion which engages with an aperture defined through the PCB. The engagement between the pin members and the PCB stably secures the PCB in position relative to the housing, which may be utilized during assembly of the electronics assembly when components of the electronics assembly are more permanently secured together.

Figure 1:
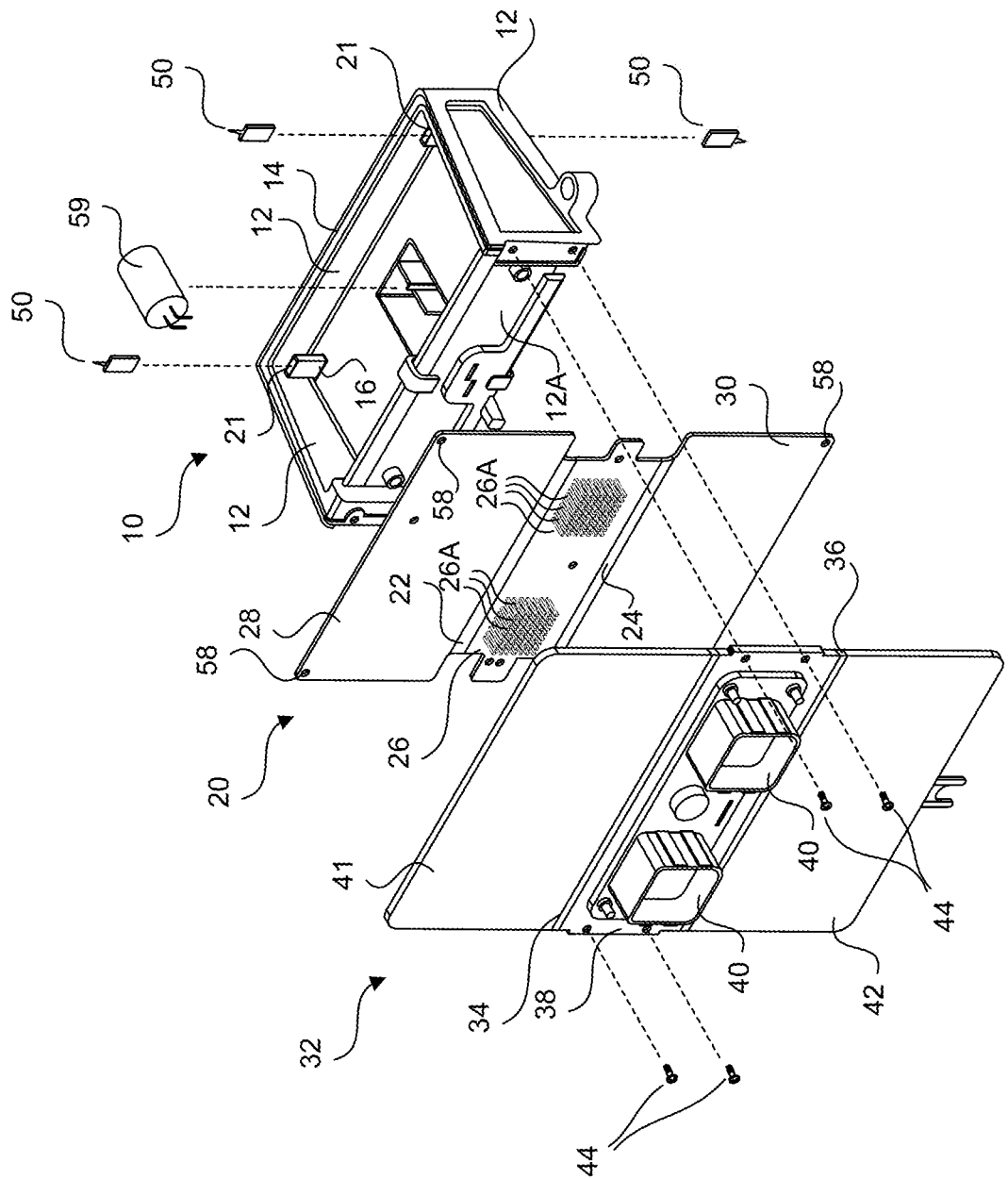
FIG. 1 is an exploded perspective view of an electronics assembly according to an example embodiment.
Figure 2:
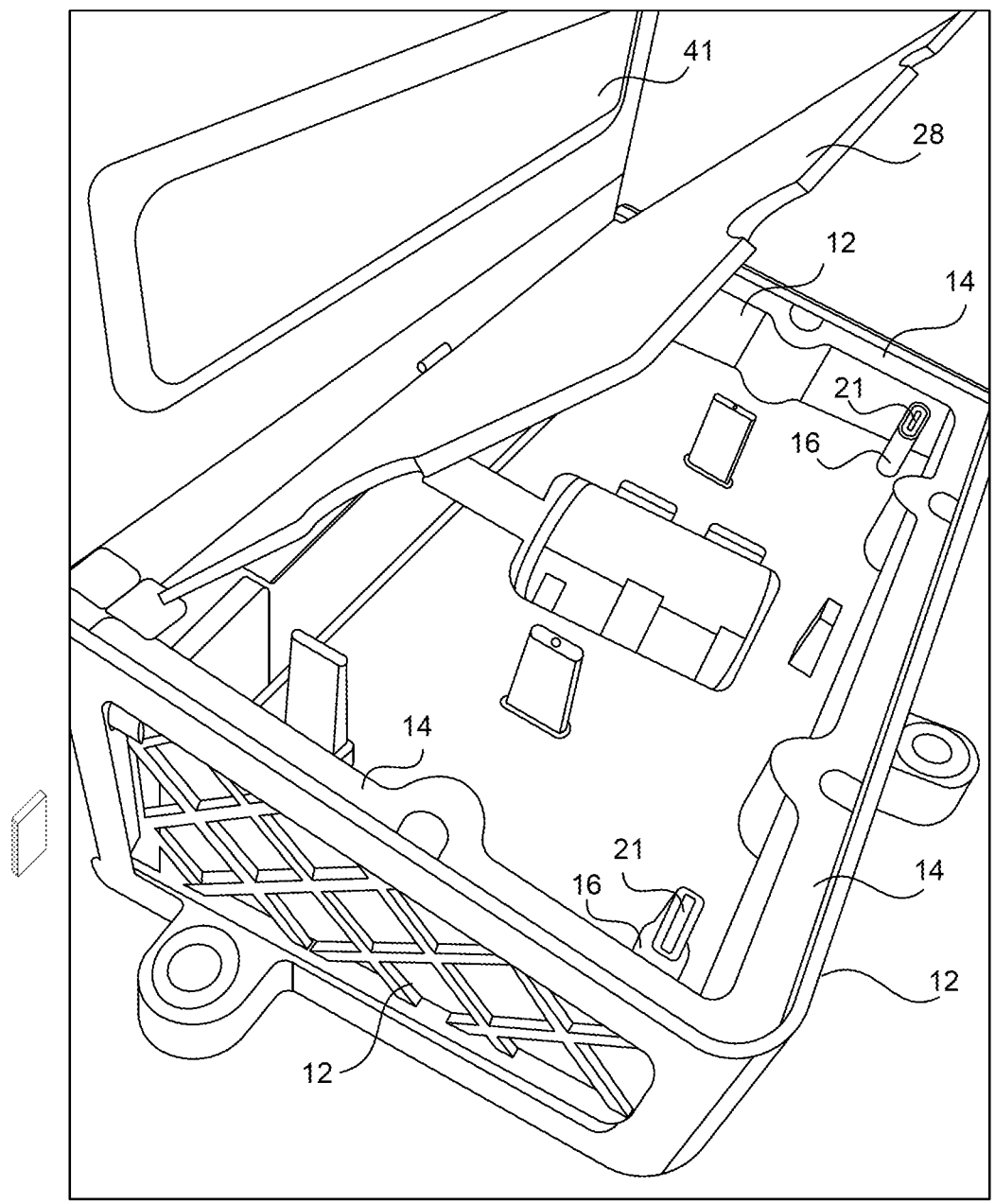
FIG. 2 is a partial perspective view of the electronics assembly of FIG. 1.

Referring to FIGS. 1-4, there is shown electronics assembly 1 according to an example embodiment. Electronics assembly 1 includes housing 10 which may include a plurality of side portions 12, each of which is disposed at an orthogonal angle relative to an adjacent side portion(s) 12 and which is disposed in parallel with an opposed side portion 12, as shown. It is understood that alternatively, each side portion may be disposed at an angle, relative to adjacent side portions 12, that is not an orthogonal angle. A first side portion 12A is configured to contact a section of a PCB, as explained in greater detail below. As shown in FIGS. 1 and 2, side portions 12 define a ledge 14 for receiving the edge portion of a housing cover, as also explained in greater detail below. Housing 10 may further include a plurality of protrusions 16 which extend from a floor 18 of the housing. Some of the protrusions 16 may include a slot 21. The use of slots 21 will be described in greater detail below. Protrusions 16 extend in an upward direction from floor 18 as shown in FIGS. 1 and 2, and may also extend downwardly from an undersurface of floor 18 (not shown). Ledges 14 are defined not only along an upper region of side portions 12 but also are defined along a lower region of side portions (not shown). In this way, housing 10 is a largely symmetrical component of electronics assembly 10. In an example embodiment, housing 10 is constructed from a rigid plastic material but it is understood that housing 10 may be constructed from another material, such as a metal. Housing 10 may be a molded component of electronics assembly 1.

In the illustrated example embodiment, electronics assembly 1 further includes a folded and/or folded PCB 20. PCB 20 includes a first fold region or axis 22 and a second fold region or axis 24. Fold regions 22, 24 extend laterally across PCB 20 and divide PCB 20 into sections on which electric and/or electronic circuit components, modules and the like are fixed (not shown). A first section 26 of PCB 20 is disposed between first fold region 22 and second fold region 24 and includes leads, pins and/or other components 26A for, among other things, connecting to an input/output (I/O) socket for electronics assembly 1

A second section 28 of PCB 20 is disposed between first fold region 22 and a lengthwise end of PCB 20. Electrical and/or electronics components, such as integrated circuits, modules, discrete components or the like (not shown), are fixed to second section 28, with PCB 20 providing electrical connectivity and power bussing between the components. The electrical and/or electronics components are soldered or otherwise secured along a surface of PCB 20 which faces housing 10 when PCB 20 is secured thereto. A third section 30 of PCB 20 is disposed between second fold region 24 and a second lengthwise end of PCB 20. Like second section 28, electrical and/or electronics components, such as integrated circuits, modules, discrete components or the like (not shown), are fixed to second section 28, with PCB 20 providing electrical connectivity and power bussing between the components. The electrical and/or electronics components are soldered or otherwise secured along a surface of PCB 20 which faces housing 10 when PCB 20 is secured thereto. Second section 28 and third section 30 may also includes leads, pins and/or other components 26A for, among other things, connecting to an input/output (I/O) socket for electronics assembly 1.

First fold region 22 and second fold region 24 may be formed from a flexible material that allows for positioning second section 28 of PCB 20 at virtually any angle relative to first section 26, such as between 0 degrees and 180 degrees. Fold regions 22, 24 may be of a different material than sections 26, 28, 30 of PCB 20, with sections 26, 28 and 30 being largely rigid. Folded and/or foldable PCBs are known in the art such that a detailed description of them will not be included for the sake of expediency.

Electronics assembly 1 further includes a housing cover 32 which is configured to connect to housing 10 and protect or shield PCB 20 and any other components disposed within housing 10 from external conditions. In an example embodiment, housing cover 32 is constructed from metal but it is understood that housing cover 32 may be constructed from other materials.

Like PCB 20, housing cover 32 is folded or foldable with a first fold region or axis 34 and a second fold region or axis 36 about which sections of cover 32 may be folded. Fold regions 34, 36 may be constructed and dimensioned using a foldable metal material. Alternatively, fold regions 36 may be implemented as hinge mechanisms or the like. Fold regions 34, 36 extend laterally across housing cover 32 and divide the cover into a number of sections. One such section is a centrally located first section 38 positioned between fold regions 34 and 36. One or more electrical sockets 40 may be attached to first section 38 for receiving connectors (not shown) from devices or systems external to electronics assembly 1 for communicating therewith. Sockets 40 engage with pins and leads 26A disposed along the first section 26 of PCB 20 for providing external connectivity to components, chips and modules secured to PCB 20.

Housing cover 32 further includes a second section 41 disposed between first fold region 34 and a lengthwise end of cover 32, and a third section 42 disposed between second fold region 36 and a second lengthwise end of cover 32. Second section 41 and third section 42 are configured to be disposed over and cover second section 28 and third section 30 of PCB 20, respectively, when such sections of PCB 20 are disposed against housing 10.

First section 26 of PCB 20 and first section 38 of housing cover 32 are secured along an outer surface of first side portion 12A of housing 10. In the example embodiment illustrated, screws 44 are used to attach first section 26 of PCB 20 and first section 38 of housing cover 32 to first side portion 12A. Screws 44 pass through housing cover 32 and PCB 20 and threadingly engage with first side portion 12A. Second section 28 of PCB 20 and second section 41 of housing cover 32 are folded relative to first section 26 of PCB 20 and first section 38 of housing cover 32, respectively, so that the second sections 28, 41 are disposed along and cover the top portion of housing 10. Similarly, third section 30 of PCB 20 and third section 42 of housing cover 32 are folded relative to first section 26 of PCB 20 and first section 38 of housing cover 32, respectively, so that the third sections 30, 42 are disposed along and cover the bottom portion of housing 10.

In an example embodiment, an adhesive is used to secure housing cover sections 41, 42 of housing cover 32 to housing 10 using an adhesive 70. Best seen in FIG. 6, adhesive 70 is disposed between ledges 14 and the peripheral end regions of sections 41, 42. For example, adhesive 70 may be placed along the peripheral end regions of housing cover sections 41, 42 prior to the housing cover sections being placed on ledges 14. When cured, the adhesive 70 provides a permanent bond or seal between housing cover 32 and housing 10.

Figure 6:
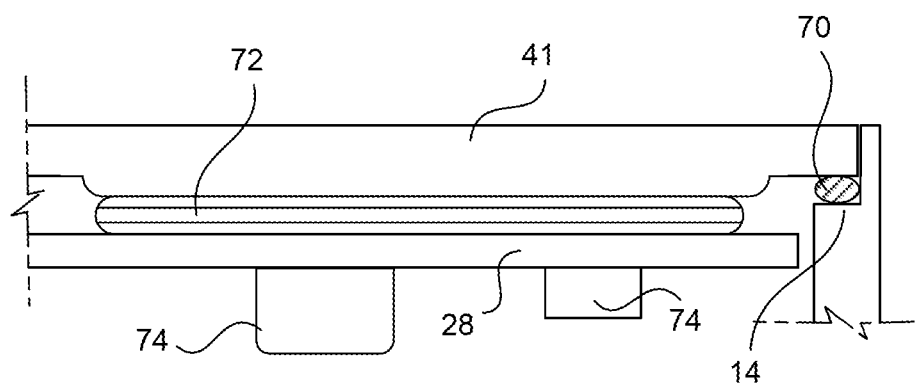
FIG. 6 is a simplified, side cross-sectional view of a portion of the electronics assembly of FIG. 1.

In addition, a thermally conductive adhesive 72 may be disposed between a central portion of housing cover first section 41 and second section 28 of PCB 20. As shown in FIGS. 2 and 6, a central region of housing cover second portion 28 protrudes from the housing cover. Thermally conductive adhesive 72 (FIG. 6) is disposed between the protruded central region and the upper surface of second section 28 of PCB 20. Thermally conductive adhesive 72 provides a bond between second section 41 of housing cover 32 and second section 28 of PCB 20. Thermally conductive adhesive 72 also provides at least part of a thermally conductive path between electrical/electronic components 74, which are disposed along the underside of second section 28 of PCB 20 and may generate an appreciable amount of heat, and second section 41 of housing cover 32. In this way, thermally conductive adhesive 72 allows for second section 41 of housing cover 32 to serve as a heat sink for electrical/electronic components 74 disposed along PCB 20.

It is understood that housing cover third section 42 may also include a centrally-located protrusion region; adhesive 70 is disposed between the ledge 14 of housing 10 and the peripheral portion of housing cover third section 42; and a thermally conductive adhesive 72 may be disposed between housing cover third section 42 and third section 30 of PCB 20 so as to serve as a heat sink for electrical/electronic components disposed on third PCB section 30.

Because the adhesive takes a period of time to cure, electronics assembly 1 includes an additional feature to stably position second section 28 and third section 30 of PCB 20 in place covering housing 10 during the curing process. According to an example embodiment, electronics assembly 1 includes a plurality of pin members 50 which generally provide at least a temporary mechanical connection between folded sections of PCB 20 and housing 10. In this way, second section 28 and third section 30 of PCB 30 are securely and stably positioned against housing 10 at least during the curing process.

Figure 3:
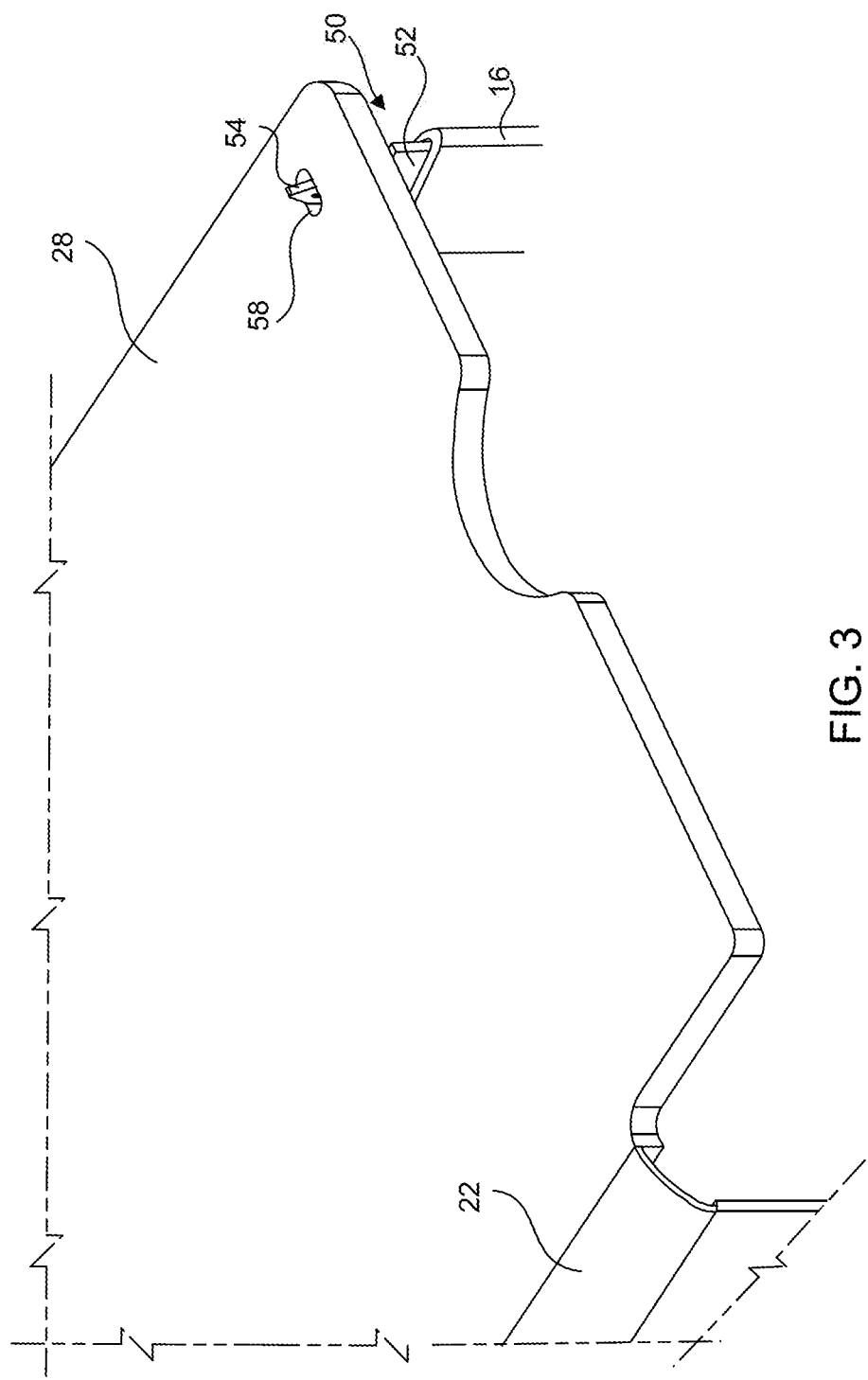
FIG. 3 is a partial perspective view of a portion of the electronics assembly of FIG. 1.
Figure 4:
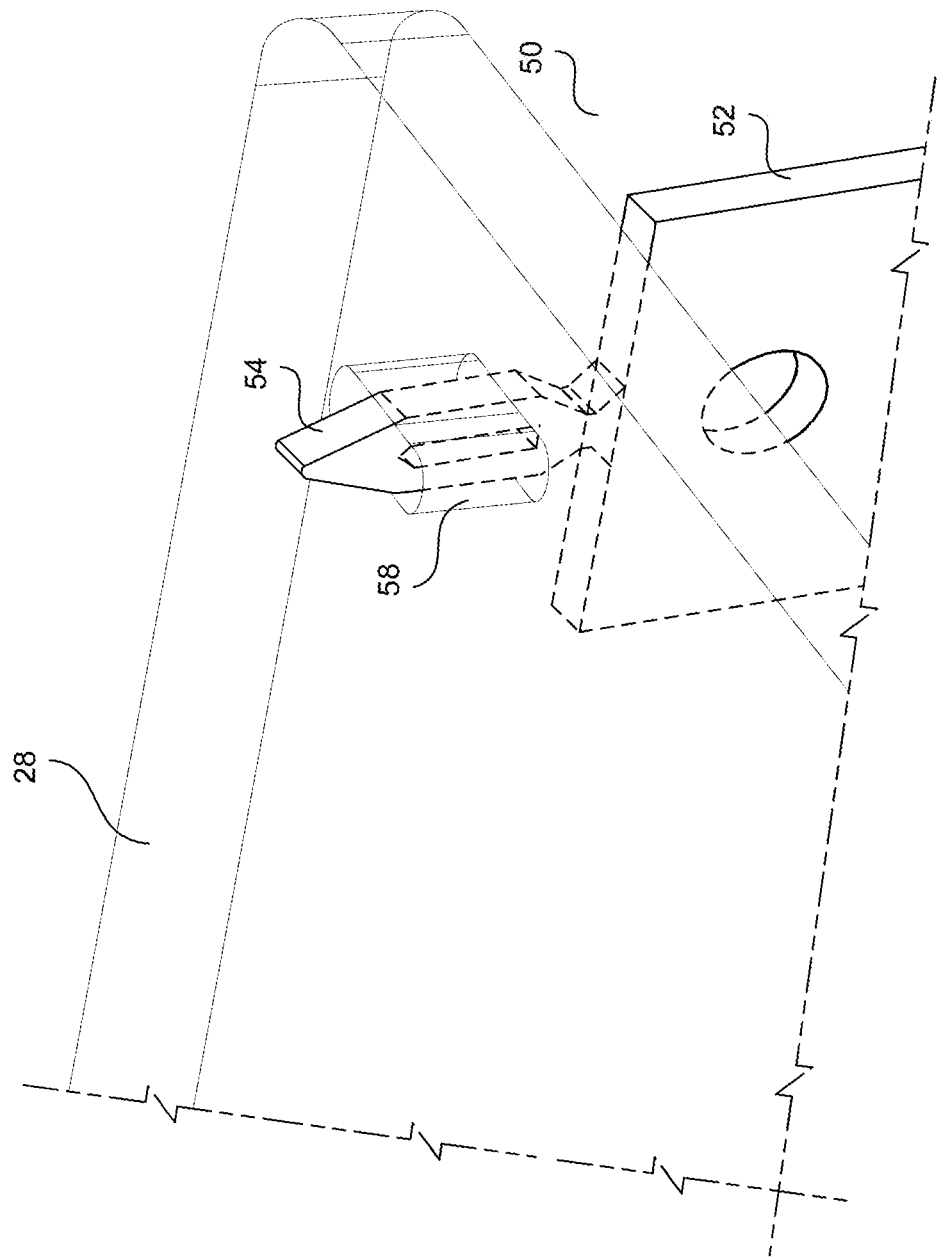
FIG. 4 is a perspective view of a pin member of the electronics assembly of FIG. 1 engaged with a PCB thereof.

Best seen in FIGS. 1, 3 and 4, each pin member 50 includes a base or body portion 52 which is sized and shaped for insertion or insert-molded within a slot 21 which securely holds body portion 52 to housing 10. Pin member 50 further includes a lead portion 54 which extends from one end of body portion 52. When body portion 52 of pin member 50 is partly inserted within a slot 21 of protrusion 16 in housing 10, lead portion 54 extends outwardly in a direction towards sections of PCB 50 and cover housing 32.

Lead portion 54 of each pin member 50 is sized and shaped for providing a press-fit engagement with a section 28, 30 of PCB 20. Best seen in FIG. 4, lead portion 54 includes a slot defined through lead portion 54. The slot allows for the lengthwise sides of lead portion 54, which define the slot, to be resiliently compressible towards each other.

In an example embodiment, pin member 50 is constructed from a metal but it is understood that pin member 50 may be constructed from other materials, such as a plastic composition.

In the example embodiments, PCB 20 includes a plurality of apertures 58 defined through the PCB at lengthwise end portions thereof. As seen in FIGS. 1, 3 and 4, each lengthwise end portion of PCB 20 includes a pair of apertures 58, with each aperture 58 being in a corner region of PCB 20. This results in a pair of apertures 58 for each of second section 28 and third section 30 of PCB 20, with each aperture 58 being disposed over a corresponding slot 21 of housing 10 when second section 28 and third section 30 of PCB 20 cover the interior of housing 10.

Each aperture 58 is sized and shaped so that a press-fit engagement is formed when the lead portion 54 of a pin member 50 is inserted in and/or through the aperture. The press-fit engagement between PCB 20 and pin members 50 at apertures 58 results in second section 28 and third section 30 of PCB 20 being stably secured in position along the upper and lower ends, respectively, of housing 10. Best seen in FIG. 3, with lead portion 54 fully inserted in or through aperture 58, PCB 20 contacts and is disposed against an end of body portion 52 of pin member 50. In addition, each aperture 58 has an oblong and/or oval shape in order to provide sufficient clearance to allow the corresponding lead portion 54 to be inserted in and engage with the aperture when the second/third section of PCB 20 is rotated into its final position over housing 10.

In the example embodiment illustrated in FIGS. 1-3, PCB 20 is a foldable and/or folded PCB. In an alternative embodiment, PCB 20 is made up of one or more flat, rigid PCBs disposed over (and/or under) housing 10. For example, PCB 20 may be implemented as a first PCB that is disposed over and/or within the upper opening of housing 10, and/or a second PCB that is disposed under and/or within the lower opening of housing 10. In this alternative embodiment, sockets 40 may be disposed against section 41 and/or third section 42 of housing cover 32 for providing electrical connectivity to the PCBs.

Figure 5:
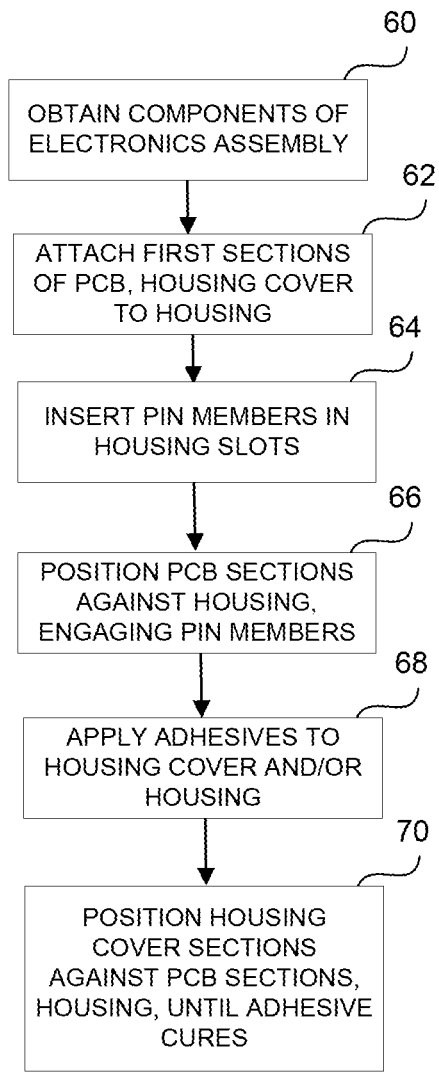
FIG. 5 is a flowchart of a method of assembling the electronics assembly according to an example embodiment.

The process for assembling electronics assembly 1 will be described in connection with FIG. 5. The acts described therein may be performed manually or by automatic means, or both, and it is understood that the acts described may have a different order than shown in FIG. 5. Initially, the components of electronics assembly 1 (i.e., housing 10, PCB 20, housing cover 32, pin members 50, etc.) are obtained at 60. First section 26 of PCB 20 and first section 38 of housing cover 32 are attached to housing 10 at 62. First sections 26 and 38 are disposed along the outer surface of first side portion 12A of housing 10. Screws 44 are used to attach housing cover 32, by passing through the PCB and housing cover for threaded engagement with housing 10.

At some point, additional components which form electronics housing assembly 1, such as discrete electrical and/or electronic component 59, are placed within housing 10.

At 64, pin members 50 are inserted partly within slots 21 of housing 10. In particular, body portion 52 of pin member 50 is partly inserted within a corresponding slot 21. When inserted, lead portion 54 of pin member 50 extends from the corresponding slot in a direction away from floor 18 of housing 10 and towards an open end of housing 10.

Second section 28 and third section 30 of PCB 20 are folded at 66, relative to first section 26 of PCB 20, against top and bottom portions of housing 10. In doing so, lead portion 54 of each pin member 50 is inserted in and/or through a corresponding aperture 58 of PCB 20. The insertion provides a press-fit engagement for stably and securely holding the PCB sections in their desired locations relative to housing 10. In its final position, second section 28 and third section 30 of PCB 20 contact a side surface of body portion 52 of pin members 50.

At some point, adhesive 70 is applied on and/or along ledges 14 of housing 10 and/or sections 28 and 30 of PCB 20 at 68. In addition, thermally conductive adhesive 72 is applied along the protruded central portion of second section 41 and third section 42 of housing cover 32. At 70, second section 41 and third section 42 of housing cover 32 are folded, relative to first section 38 of the cover, against the top and bottom portions of housing 10, thereby covering the second and third sections of PCB 20 as well as covering the interior of housing 10. This results in the peripherally outer ends of second section 41 and third section 42 of housing cover 32 contacting the adhesive 70 disposed on ledges 14 of housing 10, and central portions of sections 28 and 30 of PCB 20 contacting adhesive 72. The adhesives are then allowed or caused to cure, which forms a permanent, sealed connection between housing cover 32, PCB 20 and housing 10, and forms a heat conductive path from electrical/electronic components 74 disposed on PCB 20 and housing cover 32.

The use of pin members 50 to secure second section 28 and third section 30 of PCB 20 provides a number of benefits. For instance, apertures 58 take up less space on PCB 20, thereby allowing for more space on PCB 20 for circuits, components, modules, etc., and/or allowing for PCB 20 (and therefor housing 10, housing cover 32 and electronics assembly 1) to be smaller, which reduces manufacturing costs for electronics assembly 1. Further, the use of pin members 50 is also a simpler approach than other approaches, such as securing the position of second section 28 and third section 30 of PCB 20 using screws or the like, which results in less manufacturing costs. Sill further, the use of pin members 50 advantageously results in electronics assembly 1 weighing less than electronic assemblies utilizing other approaches for securing second and third sections of PCB 20.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. An electronics device, comprising:
  a folded printed circuit board which is folded about at least one fold region which defines a first section and a second section;
  a housing having a plurality of side portions, the first section of the folded printed circuit board is secured along an outer surface of a first side portion of the plurality of side portions, the housing further including an interior at least partly defined by the side portions, at least one first slot defined within the interior and disposed along or near a second side portion arranged opposite the first side portion; and at least one first pin member disposed partly within the at least one first slot and extending therefrom, a distal end portion of the at least one first pin member engaging with the second section of the folded printed circuit board so as to hold the second section in position over the interior of the housing.

2. The electronics device of claim 1, wherein the at least one first slot comprises a plurality of first slots, the at least one first pin member comprises a plurality of first pin members, each first pin member is partly inserted within a distinct first slot and the distal end portion of each first pin member engages with the second section of the folded printed circuit board for holding the second section relative to the housing.

3. The electronics device of claim 1, wherein the distal end of the at least one first pin member forms a press fit engagement with the second section of the folded printed circuit board.

4. The electronics device of claim 3, wherein the at least one first pin member includes a body portion from which the distal end portion extends, a width of the body portion being greater than a width of the distal end such that the body portion forms a shoulder against which the second section of the folded printed circuit board contacts.

5. The electronics device of claim 3, wherein the distal end portion of the at least one first pin member is inserted in or through a first aperture defined in the second section of the folded printed circuit board.

6. The electronics device of claim 1, further comprising a folded housing cover which is folded about at least one fold region which defines a first section and a second section of the housing cover, the first section of the housing cover is attached to the first side portion of the housing, covering the first section of the folded printed circuit board, and the second section of the housing cover covers the second section of the folded printed circuit board and is secured to the housing.

7. The electronics device of claim 6, further comprising a first adhesive securing the second section of the housing cover to the housing and a second adhesive securing the second section of the housing cover to the second section of the folded printed circuit board.

8. The electronics device of claim 1, wherein
the folded printed circuit board further comprises a second fold region spaced from the first fold region of the folded printed circuit board and defining a third section of the folded printed circuit board;
the housing further includes at least one second slot defined within the interior of the of the housing and disposed along or near the second side portion of the housing,
the at least one pin member comprises at least one second pin member partly disposed in the at least one second slot, a distal end portion of the at least one second pin member engaging with the third section of the folded printed circuit board so as to hold the third section in position under the interior of the housing.

9. The electronics device of claim 8, wherein the housing cover further comprises a second fold region spaced from the first fold region of the housing cover and defining a third section of the housing cover, the third section of the housing cover covers the third section of the folded printed circuit board and is secured to the housing.

10. The electronics device of claim 8, wherein an opening of the at least second slot faces a direction that is opposite a direction of an opening of the at least one first slot faces.

11. An electronics device, comprising:
a printed circuit board;
a housing having a plurality of side portions, the printed circuit board is secured along an outer surface of the plurality of side portions, the housing further including an interior at least partly defined by the side portions,
at least one first slot defined within an interior of the housing; and
at least one first pin member disposed partly within the at least one first slot and extending therefrom, a distal end portion of the at least one first pin member engaging with the printed circuit board so as to hold the printed circuit board in position over the interior of the housing.

12. The electronics device of claim 11, wherein the at least one first slot comprises a plurality of first slots, the at least one first pin member comprises a plurality of first pin members, each first pin member is partly inserted within a distinct first slot and the distal end portion of each first pin member engages with the printed circuit board for holding the printed circuit board to the housing.

13. The electronics device of claim 11, wherein the distal end of the at least one first pin member forms a press fit engagement with the printed circuit board.

14. The electronics device of claim 11, wherein the distal end portion of the at least one first pin member is inserted in or through at least one first aperture defined in the printed circuit board.

15. The electronics device of claim 11, further comprising a housing cover which is attached to the housing, covering and secured to the printed circuit board.

16. The electronics device of claim 15, wherein the housing cover is attached to the housing with a first adhesive and is attached to the printed circuit board with a second adhesive that is thermally conductive.

17. A method for assembling an electronics device, comprising:
obtaining a housing, a foldable printed circuit board, a foldable housing cover, and a plurality of pin members, the housing having a plurality of side portions and a plurality of slots defined within an interior of the housing, the printed circuit board comprising a fold region dividing the printed circuit board into a first section and a second section, and the housing cover comprising a fold region dividing the housing cover into a first section and a second section;
attaching the first section of the printed circuit board and the first section of the housing cover to a first side portion of the housing;
inserting the pin members partly into the slots of the housing;
positioning the second section of the printed circuit board over the interior of the housing, including engaging a distal end portion of each pin member with the second section of the printed circuit board, the engagement positioning the second section of the printed circuit board in a final position over the interior of the housing;
applying a first adhesive along a perimeter of the side portions of the housing and a second adhesive on the second section of the housing cover in a central location thereof;
positioning the second section of the housing cover so that the second section of the housing cover covers the second section of the printed circuit board and contacts the first adhesive and so that the second section of the printed circuit board contacts the second adhesive; and curing the first and second adhesives or allowing the first and second adhesives to cure, the cured first adhesive forming a sealed bond between the housing and the second section of the housing cover and the cured second adhesive forming a bond between the second section of the housing cover and the second section of the printed circuit board.

18. The method of claim 17, wherein positioning the second section of the printed circuit board and engaging the distal end portion of each pin member with second section of the printed circuit board comprise moving the second section of the printed circuit board over the interior of the housing so that the distal end portions of the pin members are caused to pass in or through apertures defined in the second section of the printed circuit board.

19. The method of claim 18, wherein causing the pin members to pass in or through the apertures of the second section of the printed circuit board creates a press fit engagement between each pin member and the second section of the printed circuit board, the press-fit engagements maintaining the second section of the printed circuit board in position during the curing of the first and second adhesives.

20. The method of claim 17, wherein the second adhesive is a thermally conductive adhesive such that the cured second adhesive forms a thermal conductive path between the second section of the housing cover and the second section of the printed circuit board.

* * * * *